United States Patent
Lytle et al.

(10) Patent No.: US 7,442,581 B2
(45) Date of Patent: Oct. 28, 2008

(54) FLEXIBLE CARRIER AND RELEASE METHOD FOR HIGH VOLUME ELECTRONIC PACKAGE FABRICATION

(75) Inventors: William H. Lytle, Chandler, AZ (US); Craig S. Amrine, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 300 days.

(21) Appl. No.: 11/009,284

(22) Filed: Dec. 10, 2004

(65) Prior Publication Data

US 2006/0128066 A1    Jun. 15, 2006

(51) Int. Cl.
*H01L 21/00* (2006.01)
(52) U.S. Cl. ....................................... 438/118; 438/127
(58) Field of Classification Search ................. 438/118, 438/126, 127; 257/783, E23.055
See application file for complete search history.

(56) References Cited

U.S. PATENT DOCUMENTS

| | | | |
|---|---|---|---|
| 4,918,811 A | 4/1990 | Eichelberger et al. | |
| 5,032,543 A | 7/1991 | Black et al. | |
| 5,144,747 A | 9/1992 | Eichelberger | |
| 5,250,843 A | 10/1993 | Eichelberger | |
| 5,474,958 A * | 12/1995 | Djennas et al. | ............... 29/827 |
| 5,866,952 A | 2/1999 | Wojnarowski et al. | |
| 6,159,767 A | 12/2000 | Eichelberger | |
| 6,429,047 B1 * | 8/2002 | Huang | ......................... 438/108 |
| 6,943,045 B2 * | 9/2005 | Kitamura et al. | ............... 438/17 |
| 2003/0230798 A1 | 12/2003 | Lin et al. | |
| 2004/0195572 A1 * | 10/2004 | Kato et al. | ..................... 257/72 |

FOREIGN PATENT DOCUMENTS

WO    WO 02/33751    4/2002

* cited by examiner

*Primary Examiner*—W. David Coleman
*Assistant Examiner*—Khiem D Nguyen
(74) *Attorney, Agent, or Firm*—Ingrassia, Fisher & Lorenz, P.C.

(57) ABSTRACT

Methods and apparatus are provided for use in manufacturing a device packaging comprising the steps of: positioning a metal substrate such as spring steel on a magnetic plate so as to expose a surface of the metal substrate; placing a first tape layer on the exposed surface of a metal substrate so as to expose a nonstick surface of the first tape layer such as PTFE; placing a second tape layer on the exposed surface of the first tape layer so as to expose a surface of the second tape layer; positioning a mold frame on the exposed surface of the second tape layer; positioning a die within the mold frame; depositing epoxy within the mold frame; curing the epoxy so as to create a molded panel; removing the mold frame; grinding the molded panel to a desired thickness; separating the first tape layer from the second tape layer so as to separate the metal substrate from the molded panel; and peeling the second tape layer from the molded panel. The process provides an efficient method for creating a chips first package.

25 Claims, 3 Drawing Sheets

FLEXIBLE CARRIER AND RELEASE METHOD FOR HIGH VOLUME ELECTRONIC PACKAGE FABRICATION

FIELD OF THE INVENTION

The present invention generally relates to a circuit device, and more particularly, to a circuit device with at least partial packaging and a method for forming partial package circuit devices.

BACKGROUND OF THE INVENTION

Circuit devices of all types, including but not limited to electrical, optical, active, and passive are generally packaged in a form that protects the circuit device, allows coupling external to the circuit device when desired, and is as low cost as possible while still allowing the functional use of the circuit device. It is becoming more common to transfer or sell circuit devices that have only been partially packaged. These partially packaged circuit devices can then be optionally combined with other circuit devices and packaged in a final form. This form of packaging thus allows flexibility with respect to the use of circuit devices. This manufacturing technology is also sometimes referred to as embedded packaging. Various forms of embedded packaging have been developed; however each method generally shares a common feature of embedding a die in the substrate itself.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

It is therefore desired to develop packaging methods and manufacturing methods that allow for the efficient and low-cost creation of partial packaged circuit devices. Various methods are presently known; however, these methods have limitations and drawbacks. Certain methods make use of a rigid backing plate on which is fabricated the chips set. In these methods it then becomes necessary to separate the backing plate from the chips set, and these separation methods have incorporated technologies such as a hot release, UV release, and solvent release. These methods add time and expense in the manufacturing process. It would also be desired to develop a method that avoids the use of solvents. Further, it would be desired to develop a method of manufacturing partial packaged circuit devices that can be easily scaled for high volume manufacturing. The present invention addresses one or more of these needs. Furthermore, other desirable features and characteristics of the present invention will become apparent from the subsequent detailed description of the invention and the appended claims, taken in conjunction with the accompanying drawings and the background of the invention.

Figure 1:
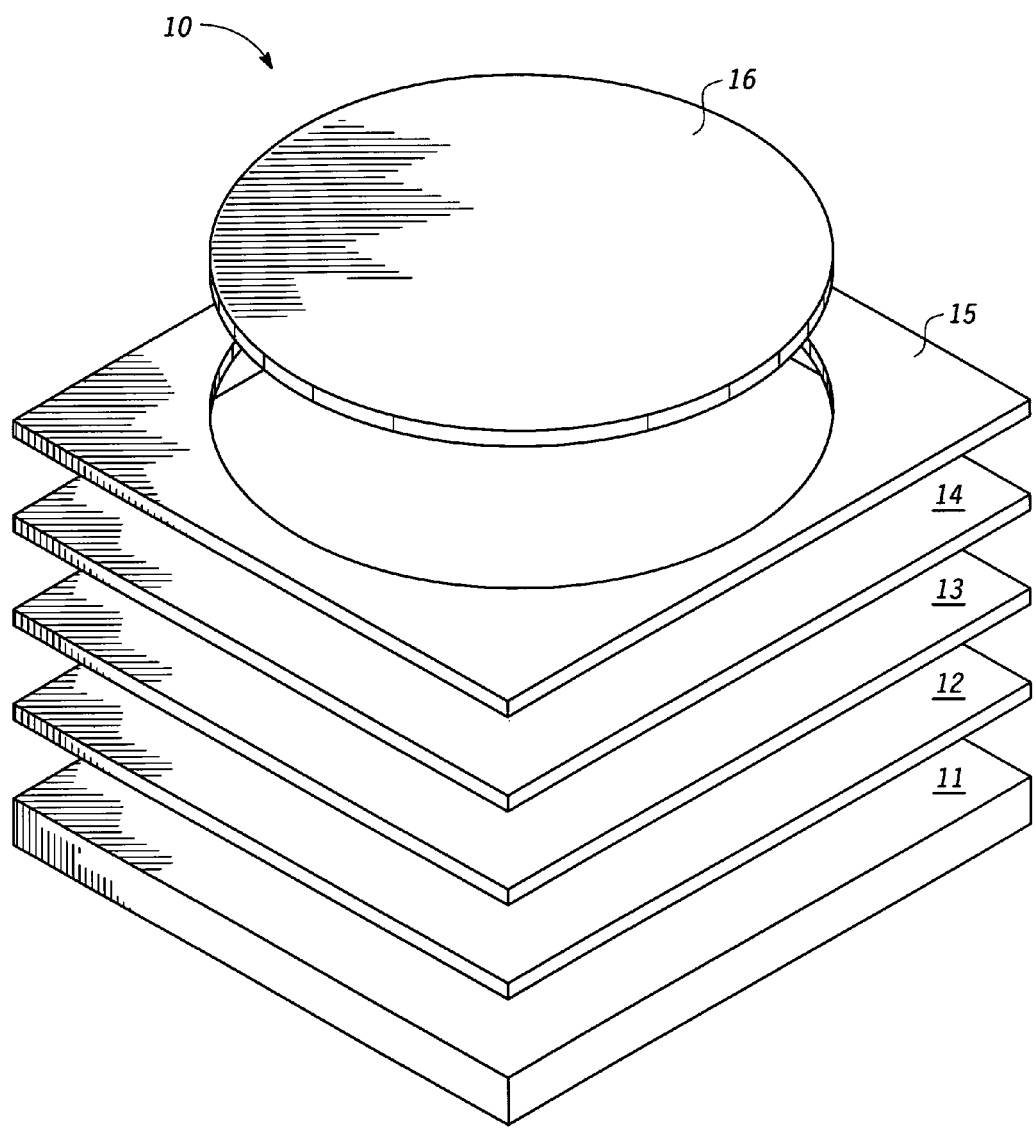
FIG. 1 is an exploded view of an assembly used in a manufacturing process according to an embodiment of the present invention.

Referring to FIG. 1 there is shown an exploded view of a panel assembly 10 used in a manufacturing process according to an embodiment of the invention. Panel assembly 10 is generated and then disassembled during a series of manufacturing steps discussed further herein. The assembly 10 is presented here to aid in understanding the process. Assembly 10 comprises, in one embodiment, a magnetic plate 11, a flexible steel substrate 12, a first tape layer 13, a second tape layer 14, a mold frame 15, and molded panel 16. It will be understood by those skilled in the art that one purpose of the panel assembly 10 is to develop molded panel 16 wherein electronic components are secured within molded panel 16 at desired locations. Further an additional purpose is to develop molded panel 16 in a rapid and cost-efficient manner.

Figure 2:
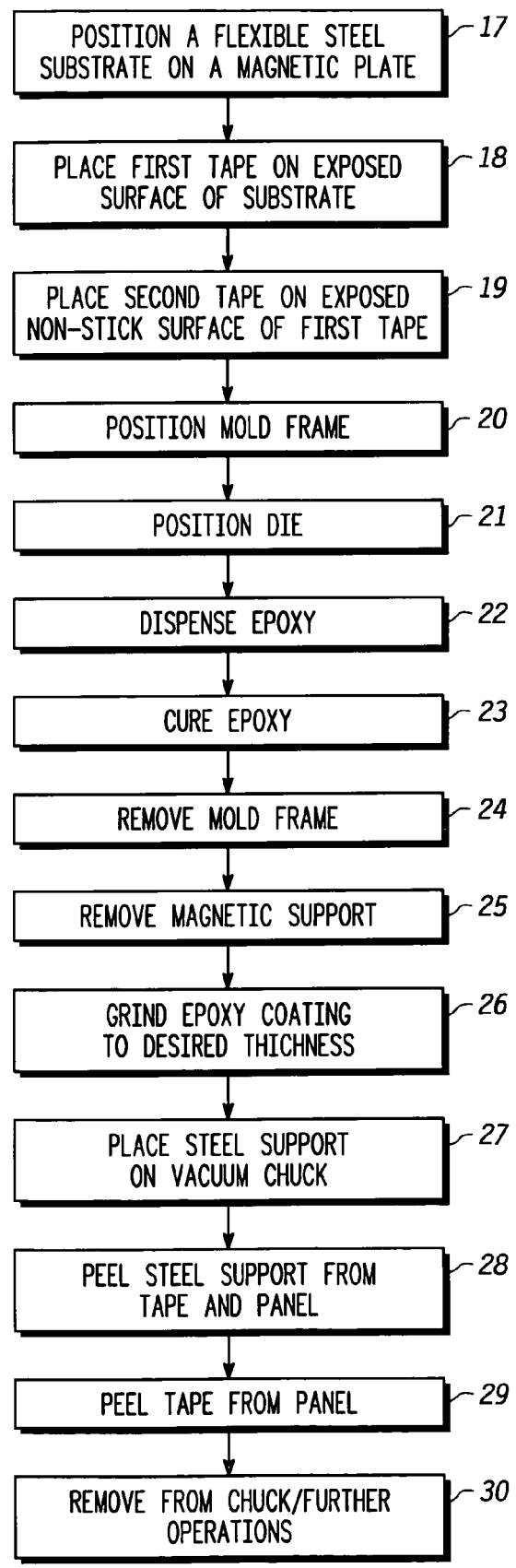
FIG. 2 is a flow chart illustrating exemplary steps in a manufacturing process according to an embodiment of the present invention.

Referring now to FIG. 2 there is shown a series of steps according to one embodiment of a manufacturing process that may be followed in high volume electronic fabrication packaging. The process begins in step 17 by positioning a flexible steel substrate 12 on a magnetic plate 11. Substrate 12 (or metal plate) thus has one surface mated with magnetic plate 11 and one exposed surface. The degree of bonding between substrate 12 and magnetic plate 11 is sufficient to allow further processing to take place as described herein, and should be understood by those skilled in the art of semiconductor processing. While a magnetic plate 11 is preferred in this process it will also be understood that other forms of gripping apparatus may be used or substituted for a magnetic plate including, by way of example only, vacuum devices and mechanical gripping devices. A flexible steel substrate approximately 1 mm thick, of spring steel, is preferred; however other thicknesses and other flexible metals may also be utilized. It is preferred to have a substrate with a thickness that ranges between approximately 0.250 mm to approximately 1.25 mm. In other embodiments, the substrate may be of a non-metal species.

In step 18 a first tape 13 (or adhesive) is adhered to the exposed surface of substrate 12. It is noted that step 18 need not follow step 17, so that in other embodiments first tape 13 is adhered to substrate 12 prior to positioning on magnetic plate 11. When first tape 13 is positioned on substrate 12 there results an exposed surface on first tape 13.

In step 19 a second tape 14 (or adhesive) is placed on the exposed surface of first tape 13. It is noted that in other embodiments of the process, second tape 14 and first tape 13 may be positioned on substrate 12 prior to joining with magnetic plate.

At this point in the process the partially packaged electrical devices may then be constructed on the second tape 14. In one embodiment, this begins in step 20 by placing mold frame 15 on the assembly previously constructed. As shown in FIG. 1 mold frame 15 defines a space or opening which, in one embodiment, is generally circular; alternate embodiments may use other shapes. Mold frame 15 may also have a desired thickness. The thickness may be selected to determine, for example, the thickness of mold material that is desired to be deposited in the opening.

In a preferred embodiment, a die is then placed within the opening of mold frame 16, step 21. Circuit devices (not shown) may also be positioned within the die or otherwise placed within the mold frame opening. As is known in the art, a combined frame and die subassembly may be inserted into the mold opening by a pick-and-place tool where the dies are placed in a specific array pattern.

Preferably second tape layer 14 comprises a two-sided adhesive tape. Thus, one side of second tape layer 14 adheres to first tape layer 13. Additionally, the opposing side of second tape layer 14 also holds mold frame 15 and die in place when these components are positioned thereon.

At this point, as shown in step 22, epoxy (or other material) may be dispensed. A spout, nozzle, or similar means then directs the liquid epoxy where desired. As will be appreciated by those skilled in the art, epoxy is deposited so that it at least partially fills the area defined by the opening in mold frame 15. Simultaneously, epoxy surrounds the dies positioned within mold frame 15.

In step 23, the epoxy may be heated or "cured". Preferably the epoxy is heated at its recommended cure cycle to completely solidify the material. In a preferred embodiment, the assembly is heated at approximately 150° C. for approximately ninety (90) minutes. It has been found that this degree of curing renders the epoxy sufficiently rigid to withstand the stresses of later processing. Curing typically takes place in a curing oven. If desired, the assembly may then be allowed to cool to approximately room temperature.

Figure 3:
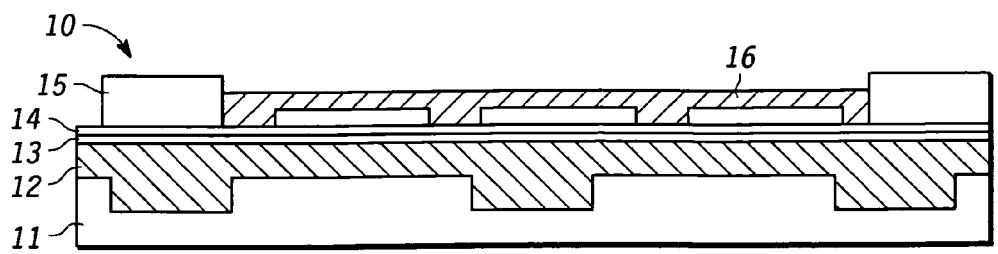
FIG. 3 is a frontal view of an assembly at one point in a manufacturing process according to an embodiment of the present invention.

The assembly at this stage in the operation is illustrated in a front view in FIG. 3. The component pieces in assembly 10 of FIG. 3 generally correspond to the exploded view of the assembly 10 shown in FIG. 1.

At this point, step 24, the mold frame may be removed. This may be done by hand process, but preferably is an automated procedure.

Figure 4:
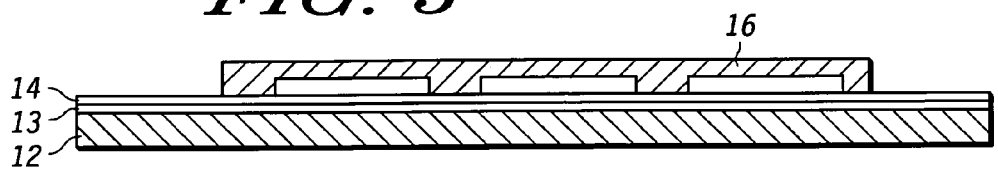
FIG. 4 is a frontal view of an assembly at another point in a manufacturing process according to an embodiment of the present invention.

As shown in step 25 the magnetic plate 11 may be removed. What remains of assembly 10 is now illustrated in FIG. 4. Heretofore the term "assembly" has been used to describe the collection of components as shown in FIG. 1 and FIG. 3 during the manufacturing process. Henceforth in the manufacturing process, components are removed from assembly 10 and/or assembly 10 is further processed. Thus, the term "circuit package structure" will be used to designate that remaining portion of assembly 10 as it undergoes further processing according to the manufacturing process.

Figure 5:
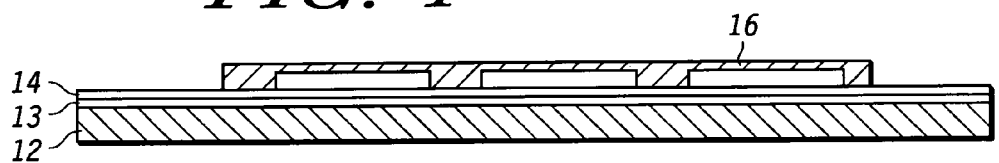
FIG. 5 is a frontal view of an assembly at still another point in a manufacturing process according to an embodiment of the present invention.

In step 26, the circuit package structure may be ground if desired. The grinding step can reduce the epoxy structure to a desired thickness. In a preferred embodiment, the mold grinding apparatus includes a dedicated magnetic chuck. Thus, as shown in step 25 the circuit package structure is removed from magnetic plate 11. It will thus be understood by those skilled in the art that other procedures may be followed for supporting the circuit package structure during an optional grinding step such as, for example, maintaining the circuit package structure on magnetic plate 11 and grinding molded panel 16 while positioned on that support. FIG. 5 illustrates an exemplary circuit package structure after grinding step 26.

Figure 6:
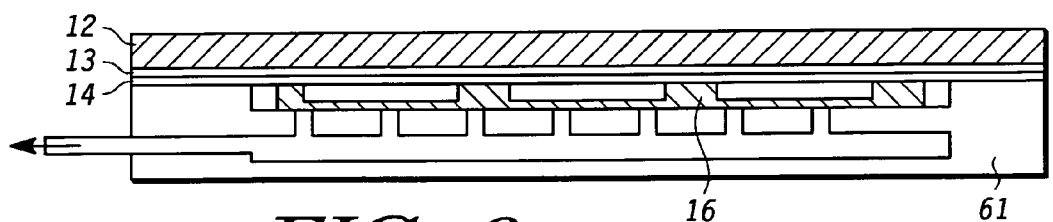
FIG. 6 is a frontal view of an assembly at still another point in a manufacturing process according to an embodiment of the present invention.

At this point, step 27, the circuit package structure is placed on a further support such as a vacuum chuck 61. Referring now to FIG. 6 there is shown the circuit package structure supported on vacuum chuck 61. It is noted that, in this embodiment, circuit package structure has been inverted. Molded panel 16 is now connected to vacuum chuck, whereas previously circuit package structure had been supported by metal plate 11 connected to support 12. By inverting the circuit package structure and positioning it on a vacuum chuck 61, the circuit package structure may be further manipulated as described below.

Figure 7:
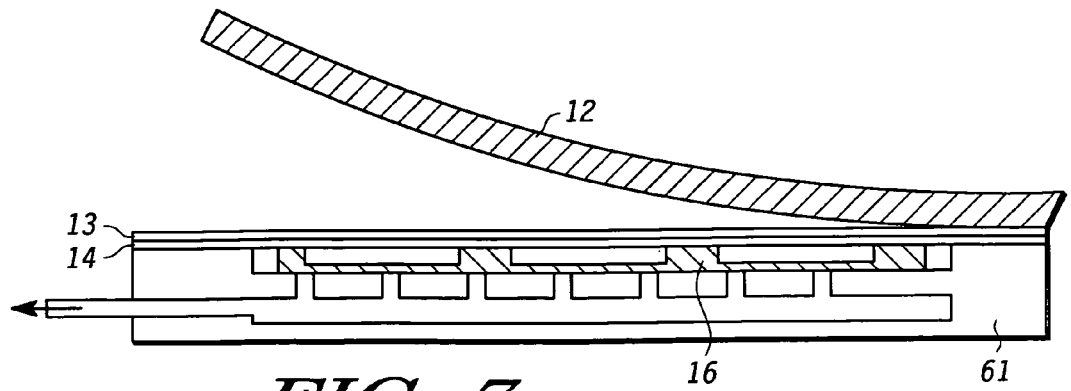
FIG. 7 is a frontal view showing removal of a flexible steel support from a molded panel at still another point in a manufacturing process according to an embodiment of the present invention.

In step 28, the molded panel 16 can be separated from the substrate 12. This is illustrated in FIG. 7. Here it is seen that by holding molded panel 16 against vacuum chuck 61, the molded panel 16 remains after substrate 12 is removed.

Figure 8:
FIG. 8 is a frontal view of a molded panel at the conclusion of the manufacturing process according to an embodiment of the present invention.

Still referring to the steps in FIG. 2, molded panel 16 may be further processed. In step 29 tape is separated from molded panel 16. Thus, according to an embodiment, first tape layer 13 and second tape layer 14 are designed so that a separation occurs between these layers when, in step 28, flexible steel support 12 is removed. In step 28, first tape layer 13 is remains with steel support 12 as it is removed. Second tape layer 14 remains with molded panel 16. Thus, in step 29 second tape layer 14 is removed from molded panel 16. What remains is illustrated in FIG. 8, a molded panel 16 which may have circuit devices positioned therein.

Next in step 30 molded panel 16 is removed from the vacuum chuck 61 or sent on for further processing, as is known in the art.

While the preferred embodiment has been described as utilizing two tape layers, a first tape 12 and a second tape 13, it will be understood that other embodiments may employ a single tape layer. It has been found, however, that a double tape layer of the preferred embodiment is advantageous. The advantage is the easier separation that takes place when molded panel 16 is removed from the circuit package structure. It is often the case that molded panel 16 includes tight specifications regarding the placement and positioning of electronic devices thereon. Thus, it is desired to avoid any severe jostling or deformation of the molded panel 16 during processing lest this positioning be disturbed. Hence, it has been found that the use of two tape layers allows for the separation of molded panel 16 with little mechanical stress to the panel. A single layer of tape has been found to be less satisfactory in that regard.

In a further embodiment, a layer of non-stick coating such as PTFE is substituted for first tape layer 13. In this embodiment the surface of substrate 12 that would receive the first tape layer 13 is instead coated with a non-stick material. PTFE (polytetrafluoroethylene), also sometimes referred to by the trademark "TEFLON", is a preferred non-stick material. A layer of PTFE may be deposited onto the substrate 12 through known means. A PTFE layer can achieve the same functionality as described with respect to first tape layer 13. That is, the PTFE layer allows second tape layer 14 to adhere to the PTFE surface. However, when it comes time to separate substrate 12 from molded panel (step 28) the non-stick PTFE surface allows a ready separation from second tape layer 14.

First tape layer 13 is preferably a tape having two surfaces with one surface having adhesive and the opposite surface having a non-stick (PTFE) material. First tape layer 13 is applied to substrate 12 so that the adhesive portion bonds first tape layer 13 to substrate 12. In this manner the non-stick surface of first tape layer 13 is exposed. When second tape layer 14 is applied, it will be applied onto the non-stick surface of first tape layer 13. By thus exposing a non-stick surface on first tape layer 13, it allows a separation between first tape layer 13 and second tape layer 14.

Second tape layer 14 is also a tape with two surfaces. This tape is designed so that it sticks somewhat, but not too much, to the taped (or coated) steel substrate 12. A degree of stickiness is needed in order to hold the assembly 10 in position during processing. However, the tape layers must also allow for separation without doing too much violence to molded panel 16, and thus it is desired not to have too much stickiness in second tape layer 14. In one embodiment second tape layer 14 has one surface of acrylic material and a second surface of a filled silicone material. The surface of acrylic material is the surface to be put in contact with first tape layer 13, or the lower surface. The filled silicone surface, or upper surface, is the surface to be put in contact with mold frame 15 and molded panel 16. Acrylic material is chosen to be placed in contact with first tape layer 13 because it has been found to display an easy and clean peel away behavior from the PTFE surface of first tape layer 13.

The filled silicone layer includes a material of inorganic filler. In one embodiment, this inorganic filler is calcium carbonate. It has been found that a filled silicone material improves the separation between the second tape layer 14 and molded panel 16. It is desired that the separation leave a molded panel 16 that is relatively free of contamination or tape residue. A filled silicone thus provides a clean separation with molded panel 16 so that molded panel 16 does not have a degree of organic material or tape residue that would impede further processing or usage.

In a preferred embodiment, second tape layer is up to approximately 200 microns thick. The filled silicone layer is up to approximately 100 microns thick, and the acrylic layer is up to approximately 100 microns thick.

The manufacturing process described above has referred to various pieces of manufacturing machinery such as a magnetic plate, vacuum chuck, and a pick and place tool. It is intended that these items be utilized and selected as is understood in the semiconductor manufacturing industry.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention; it should be understood that various changes may be made in the function and arrangement of elements described in an exemplary embodiment without departing from the scope of the invention as set forth in the appended claims.

What is claimed is:

1. A method for use in manufacturing a device packaging comprising the steps of:
   positioning a substrate on a magnetic plate;
   placing a first tape layer on the substrate;
   placing a second tape layer on the first tape layer;
   positioning multiple electronic devices on the second tape layer after placing the second tape layer on the first tape layer;
   depositing epoxy on the second tape layer to create a molded panel containing the multiple electronic devices;
   separating the first tape layer from the second tape layer so as to separate the substrate from the molded panel; and
   peeling the second tape layer from the molded panel without the use of solvents.

2. The method according to claim 1 wherein the step of depositing epoxy further comprises the steps of:
   positioning a mold frame on the second tape layer;
   positioning a die within the mold frame;
   depositing epoxy within the mold frame;
   curing the epoxy so as to create the molded panel;
   removing the mold frame; and
   grinding the molded panel to a desired thickness. The method according to claim 1 wherein the substrate comprises a flexible steel substrate.

3. The method according to claim 1 wherein the substrate comprises a Flexible substrate.

4. The method according to claim 1 wherein the substrate comprises a metal substrate.

5. The method according to claim 1 further comprising the step of attaching the molded panel to a vacuum chuck prior to separating the first tape layer from the second tape layer.

6. The method according to claim 1 wherein the second tape layer comprises an acrylic layer in contact with the first tape layer.

7. The method according to claim 1 wherein the second tape layer comprises a filled silicone layer in contact with the mold frame and the molded panel.

8. The method according to claim 1 wherein the first tape layer comprises a PTFL layer in contact with the second tape layer.

9. A method for use in manufacturing a device packaging comprising the steps of:
   positioning a metal substrate on a magnetic plate;
   placing a first tape layer on the metal substrate;
   placing a second tape layer on the first tape layer;
   positioning a mold frame on the second tape layer;
   placing multiple electronic devices on the second tape layer;
   positioning a die within the mold frame;
   depositing epoxy on the second tape layer and within the mold frame;
   curing the epoxy so as to create a molded panel containing the multiple electronic devices;
   removing the mold frame;
   grinding the molded panel to a desired thickness;
   separating the first tape layer from the second tape layer so as to separate the metal substrate from the molded panel; and
   peeling the second tape layer from a surface of the molded panel to expose the multiple electronic devices through the surface of the molded panel.

10. The method according to claim 9 wherein the metal substrate comprises a flexible steel substrate.

11. The method according to claim 9 further comprising the step of attaching the molded panel to a vacuum chuck prior to separating the first tape layer from the second tape layer.

12. The method according to claim 9 wherein the second tape layer comprises an acrylic layer in contact with the first tape layer.

13. The method according to claim 9 wherein the second tape layer comprises a filled silicone layer in contact with the mold frame and the molded panel.

14. The method according to claim 9 wherein the first tape layer comprises a PTFE layer in contact with the second tape layer.

15. The method according to claim 9 further comprising the step of removing the magnetic plate from the metal substrate prior to the step of grinding the molded panel.

16. The method according to claim 9 wherein the step of curing the epoxy comprises heating at approximately 150° C. for approximately 90 minutes.

17. A method for use in manufacturing a device packaging comprising the steps of:
   positioning a metal substrate on a magnetic plate so as to expose a surface of the metal substrate;
   placing a nonstick material on the exposed surface of the metal substrate thereby creating a nonstick surface;
   placing a tape layer having a first major surface and a second major surface on the metal substrate such that the first major surface of the tape layer contacts the nonstick surface of the metal substrate, the first major surface disposed substantially opposite the second major surface;
   positioning a mold frame on the second major surface of the tape layer;
   placing multiple electronic devices on the second major surface of the tape layer;
   positioning a die within the mold frame;
   depositing epoxy within the mold frame on the second major surface of the tape layer;
   curing the epoxy so as to create a molded panel containing the multiple electronic devices;
   removing the mold frame;
   grinding the molded panel to a desired thickness;
   separating the metal substrate from the tape layer so as to separate the metal substrate from the molded panel; and
   peeling the tape layer from the molded panel without the use of solvents to expose the multiple electronic devices.

18. The method according to claim 17 wherein the metal substrate comprises a flexible steel substrate.

19. The method according to claim 17 wherein the nonstick material comprises PTFL.

20. The method according to claim 17 wherein the tape layer comprises an acrylic layer in contact with the nonstick surface.

21. The method according to claim 17 wherein the tape layer comprises a filled silicone layer in contact with the mold frame and the molded panel.

22. The method according to claim 21 wherein the filled silicone layer comprises calcium carbonate filler.

23. The method according to claim 17 wherein the tape layer is up to approximately 200 microns in thickness.

24. The method according to claim 20 wherein the acrylic layer is up to approximately 100 microns in thickness.

25. The method according to claim 21 wherein the filled silicone layer is up to approximately 100 microns in thickness.

* * * * *

UNITED STATES PATENT AND TRADEMARK OFFICE
CERTIFICATE OF CORRECTION

PATENT NO.        : 7,442,581 B2                                            Page 1 of 1
APPLICATION NO. : 11/009284
DATED             : October 28, 2008
INVENTOR(S)       : William H. Lytle It is certified that error appears in the above-identified patent and that said Letters Patent is hereby corrected as shown below:

Column 6, line 16, "Flexible" should be changed to --flexible steel--;
Column 6, line 29, "PTFL" should be changed to --PTFE--;
Column 8, line 10, "PTFL" should be changed to --PTFE--;

Signed and Sealed this

Twenty-seventh Day of January, 2009

JOHN DOLL
*Acting Director of the United States Patent and Trademark Office*